US012604715B2

(12) United States Patent
Hsu et al.

(10) Patent No.: US 12,604,715 B2
(45) Date of Patent: Apr. 14, 2026

(54) ISOLATION STRUCTURE AND MEMORY DEVICE

(71) Applicant: Winbond Electronics Corp., Taichung City (TW)

(72) Inventors: Che-Jui Hsu, Taichung City (TW); Ying-Fu Tung, Taichung City (TW); Chun-Sheng Lu, Taichung City (TW); Mu-Lin Li, Taichung City (TW)

(73) Assignee: Winbond Electronics Corp., Taichung City (TW)

( * ) Notice: Subject to any disclaimer, the term of this patent is extended or adjusted under 35 U.S.C. 154(b) by 0 days.

(21) Appl. No.: 18/616,199

(22) Filed: Mar. 26, 2024

(65) Prior Publication Data

US 2024/0234201 A1     Jul. 11, 2024

Related U.S. Application Data

(62) Division of application No. 17/499,853, filed on Oct. 12, 2021, now Pat. No. 11,972,972.

(30) Foreign Application Priority Data

Nov. 4, 2020     (TW) ................................. 109138354

(51) Int. Cl.
*H10W 10/00*          (2026.01)
*H10B 41/30*          (2023.01)
(Continued)

(52) U.S. Cl.
CPC .......... *H10W 10/014* (2026.01); *H10B 41/30* (2023.02); *H10P 30/40* (2026.01);
(Continued)

(58) Field of Classification Search
CPC ......... H01L 21/76831; H01L 21/76832; H01L 21/76835; H01L 21/76264–76291;
(Continued)

(56) References Cited

U.S. PATENT DOCUMENTS

2008/0014711 A1     1/2008   Choi et al.
2009/0191687 A1*    7/2009   Hong ................ H01L 21/76232
                                                          257/E21.546

(Continued)

FOREIGN PATENT DOCUMENTS

CN          103681452          3/2014
CN          106298673          1/2017
(Continued)

OTHER PUBLICATIONS

"Office Action of China Counterpart Application", issued on Aug. 23, 2024, pp. 1-7.
(Continued)

*Primary Examiner* — Julio J Maldonado
*Assistant Examiner* — Stanetta D Isaac
(74) *Attorney, Agent, or Firm* — JCIPRNET

(57)          ABSTRACT

An isolation structure, comprising: an isolation material layer, filled in a trench of a substrate; and a protection layer, having two portions extending from a topmost surface of the substrate to a top surface of the isolation material layer across boundaries of the trench, and covering opposite edges of the isolation material layer, wherein the two portions of the protection layer are laterally spaced apart from each other, and the protection layer has an etching selectivity with respect to the isolation material layer.

19 Claims, 15 Drawing Sheets

(51) Int. Cl.

| | | |
|---|---|---|
| *H10P 30/40* | (2026.01) | |
| *H10P 50/28* | (2026.01) | |
| *H10W 10/13* | (2026.01) | |
| *H10W 10/17* | (2026.01) | |

(52) U.S. Cl.
CPC ....... *H10P 50/283* (2026.01); *H10W 10/0121* (2026.01); *H10W 10/13* (2026.01); *H10W 10/17* (2026.01)

(58) Field of Classification Search
CPC ........... H01L 21/02337; H01L 21/0234; H01L 21/76224; H01L 21/31111; H01L 21/31155; H01L 21/76205; H01L 21/02332; H01L 21/76237; H10B 41/30; H10W 10/014; H10W 10/0143; H10W 10/10; H10W 10/13; H10W 10/17; H10P 14/6526; H10P 14/6532
See application file for complete search history.

(56) References Cited

U.S. PATENT DOCUMENTS

2014/0167210 A1* 6/2014 Hu ................... H01L 21/76224
438/424
2018/0308929 A1* 10/2018 Liu ..................... H01L 29/0653

FOREIGN PATENT DOCUMENTS

| | | |
|---|---|---|
| CN | 108735750 | 11/2018 |
| CN | 210535646 | 5/2020 |
| KR | 20040041861 | 5/2004 |
| KR | 100652419 | 12/2006 |

OTHER PUBLICATIONS

"Office Action of China Counterpart Application", issued on Feb. 12, 2025, p. 1-p. 8.

* cited by examiner

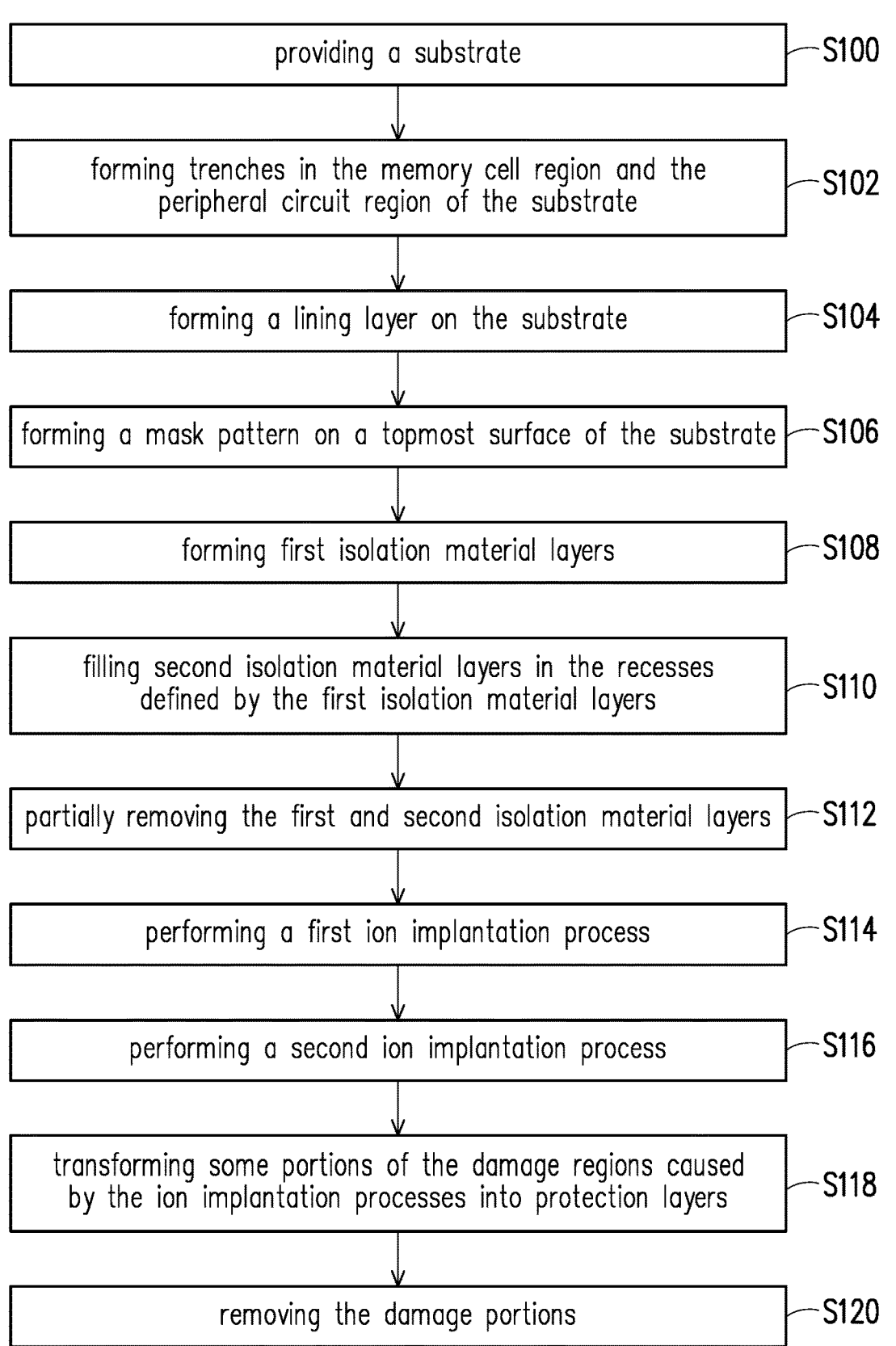

providing a substrate —S100 forming trenches in the memory cell region and the peripheral circuit region of the substrate —S102 forming a lining layer on the substrate —S104 forming a mask pattern on a topmost surface of the substrate —S106 forming first isolation material layers —S108 filling second isolation material layers in the recesses defined by the first isolation material layers —S110 partially removing the first and second isolation material layers —S112 performing a first ion implantation process —S114 performing a second ion implantation process —S116 transforming some portions of the damage regions caused by the ion implantation processes into protection layers —S118 removing the damage portions —S120

FIG. 1

ISOLATION STRUCTURE AND MEMORY DEVICE

CROSS-REFERENCE TO RELATED APPLICATION

This application is a divisional application of and claims the priority benefit of a prior U.S. application Ser. No. 17/499,853, filed on Oct. 12, 2021, now allowed, which claims the priority benefit of Taiwan application serial no. 109138354, filed on Nov. 4, 2020. The entirety of each of the above-mentioned patent applications is hereby incorporated by reference herein and made a part of this specification.

BACKGROUND

Technical Field

Embodiments of the present invention relates to an isolation structure and a manufacturing method thereof, and more particularly, to a trench isolation structure and a manufacturing method thereof.

Description of Related Art

An isolation structure in a semiconductor wafer is disposed for electrically and physically separating active regions of semiconductor devices. A trench isolation structure is a comprehensively used isolation structure. A method for forming the trench isolation structure includes forming a trench at a surface of a substrate, and then filling an insulating material into this trench. Subsequently, a height of this insulating material is adjusted, such that a top surface of this insulating material becomes substantially coplanar with the surface of the substrate. Typically, an etching process is used for adjusting the height of the insulating material. During the etching process, active regions of the semiconductor devices may be subjected to damages. Consequently, performance of the semiconductor devices may be compromised.

SUMMARY

An isolation structure and a manufacturing method thereof are provided for preventing possible damages on the active regions.

In an aspect of the present disclosure, a manufacturing method of an isolation structure is provided. The method comprises: forming a trench at a surface of the substrate; forming a mask pattern on the substrate, wherein the mask pattern has an opening communicated with the trench; filling a first isolation material layer in the trench and the opening, wherein a surface of the first isolation material layer defines a first recess; filling a second isolation material layer into the first recess; removing a portion of the second isolation material layer and a portion of the first isolation material layer, to form a second recess in the opening of the mask pattern; performing a first ion implantation process, during which first ions strike the second recess from a first side of the second recess, to form a first damage region at least in the first isolation material layer; performing a second ion implantation process, during which second ions strike the second recess from a second side of the second recess, to form a second damage region at least in the first isolation material layer, wherein the first and second sides are opposite sides of the second recess; performing a decoupled plasma treatment, to transform a portion of the first damage region and a portion of the second damage region into a protection layer, wherein the protection layer has an etching selectivity with respect to the first and second damage regions; and removing the first and second damage regions, wherein the isolation structure at least comprises remained portions of the first isolation material layer.

In another aspect of the present disclosure, a manufacturing method of an isolation structure is provided. The method comprises: forming a first trench and a second trench at a surface of a substrate, wherein a width of the second trench is greater than a width of the first trench; forming a mask pattern on the substrate, wherein the mask pattern has a first opening communicated with the first trench, and has a second opening communicated with the second trench; filling a first isolation material layer into the communicated first trench and first opening as well as the communicated second trench and second opening, wherein a surface of the first isolation material layer defines a first recess; filling a second isolation material layer into the first recess; removing a portion of the second isolation material layer and a portion of the first isolation material layer, to form a third recess in the first opening, and form a fourth recess in the second opening; performing a first ion implantation process, during which first ions obliquely strike the third and fourth recesses from a first side of the third and fourth recesses, to form a first damage region at least in the first isolation material layer; performing a second ion implantation process, during which second ions obliquely strike the third and fourth recesses from a second side of the third and fourth recesses, to form a second damage region at least in the first isolation material layer, wherein the first and second sides are opposite sides of the third and fourth recesses; performing a decoupled plasma treatment, to transform portions of the first and second damage regions into protection layers, wherein the protection layers have an etching selectivity with respect to the first and second damage regions; and removing the first and second damage regions, wherein the isolation structure at least comprises remained portions of the first isolation material layer.

In yet another aspect of the present disclosure, an isolation structure is provided. The isolation structure comprises: an isolation material layer, filled in a trench of a substrate; and a protection layer, having two portions covering opposite edges of the isolation material layer, wherein the two portions of the protection layer are laterally spaced apart from each other, and the protection layer has an etching selectivity with respect to the isolation material layer.

As above, since the etching rate of the protection layers is lower than the etching rate of other portions of the damage regions, the protection layers can protect the top corners of the active regions during removal of the damage regions, so as to prevent etchants from entering the active regions from these top corners. Therefore, compromise on performance of the electronic devices subsequently formed on the active regions can be avoided.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

FIG. 1 is a process flow diagram illustrating a manufacturing method of an isolation structure according to some embodiments of the present invention.

DESCRIPTION OF THE EMBODIMENTS

FIG. 1 is a process flow diagram illustrating a manufacturing method of an isolation structure according to some embodiments of the present invention. FIG. 2A through FIG. 2J are schematic cross-sectional views illustrating structures at various stages of the manufacturing method of the isolation structure shown in FIG. 1.

Figure 2A:
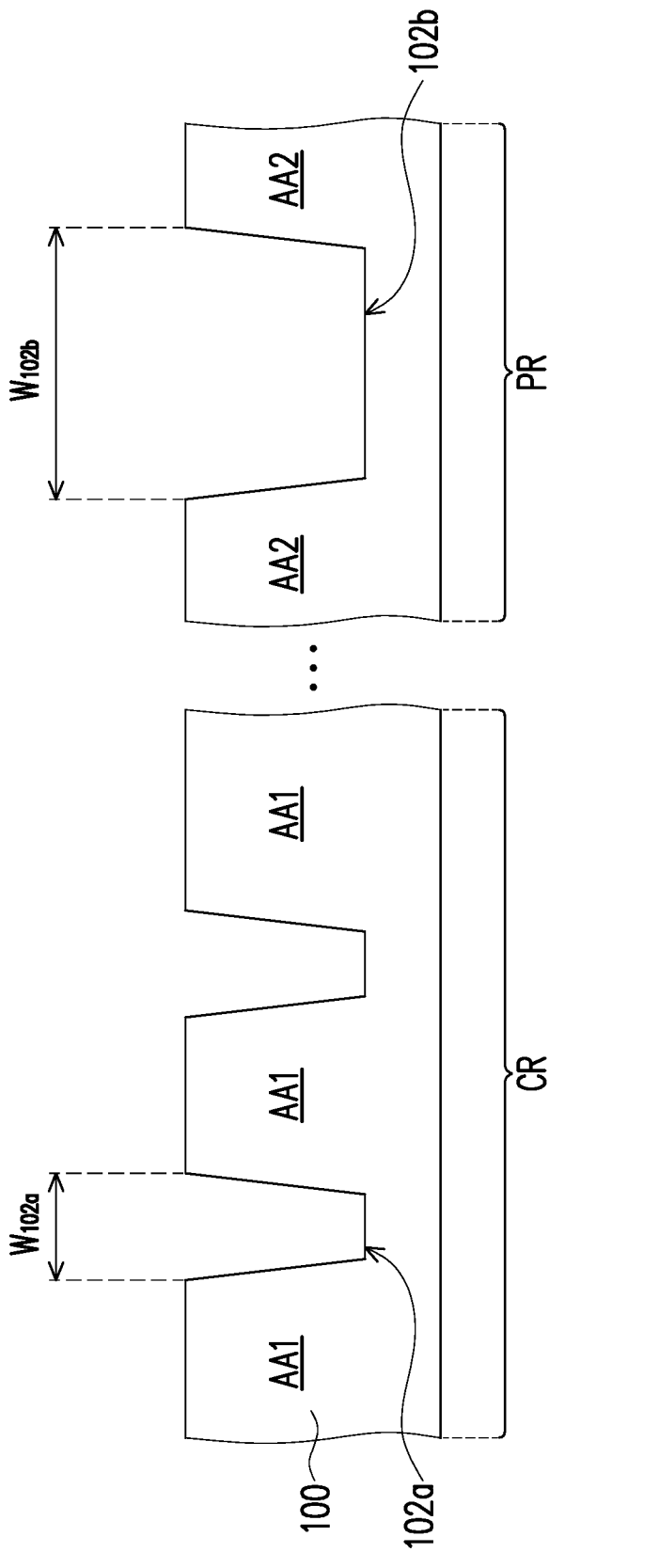
FIG. 2A through FIG. 2J are schematic cross-sectional views illustrating structures at various stages of the manufacturing method of the isolation structure shown in FIG. 1.

Referring to FIG. 1 and FIG. 2A, step S100 is performed, and a substrate 100 is provided. In some embodiments, the substrate 100 is a semiconductor wafer or a semiconductor-on-insulator (SOI) wafer. In addition, the substrate 100 may be divided into a memory cell region CR and a peripheral circuit region PR. After a series of processes have been performed, memory devices may be formed in the memory cell region CR, while circuits for controlling these memory devices may be formed in the peripheral circuit region PR. As compared to devices in the peripheral circuit region PR, active regions of the memory devices in the memory cell region CR are highly compact, and spacing between these active regions is rather small. Accordingly, a width of each isolation structure configured for separating adjacent memory devices is significantly shorter than a width of each isolation structure in the peripheral circuit region PR.

Step S102 is performed, and trenches 102a are formed in the memory cell region CR, while a trench 102b is formed in the peripheral circuit region PR. The trenches 102a are formed for accommodating the isolation structures (e.g., the isolation structures 114a as shown in FIG. 2J) to be formed within the memory cell region CR in the following steps, whereas the trench 102b is formed for accommodating the isolation structure (e.g., the isolation structure 114b as shown in FIG. 2J) to be formed within the peripheral circuit region PR in the following steps. That is, the trenches 102a may define active regions AA1 within the memory cell region CR, whereas the trench 102b may define active regions AA2 within the peripheral circuit region PR. A width $W_{102a}$ of each of the trenches 102a for accommodating the isolation structures to be formed within the memory cell region CR may be significantly shorter than a width $W_{102b}$ of the trench 102b for accommodating the isolation structure to be formed within the peripheral circuit region PR. For instance, a ratio of the width $W_{102b}$ over the width $W_{102a}$ may range from 2.8 to 3.3. The trench 102b depicted in FIG. 2B may be a section of a continuously extending trench, or may be one of multiple separated trenches.

Figure 2B:
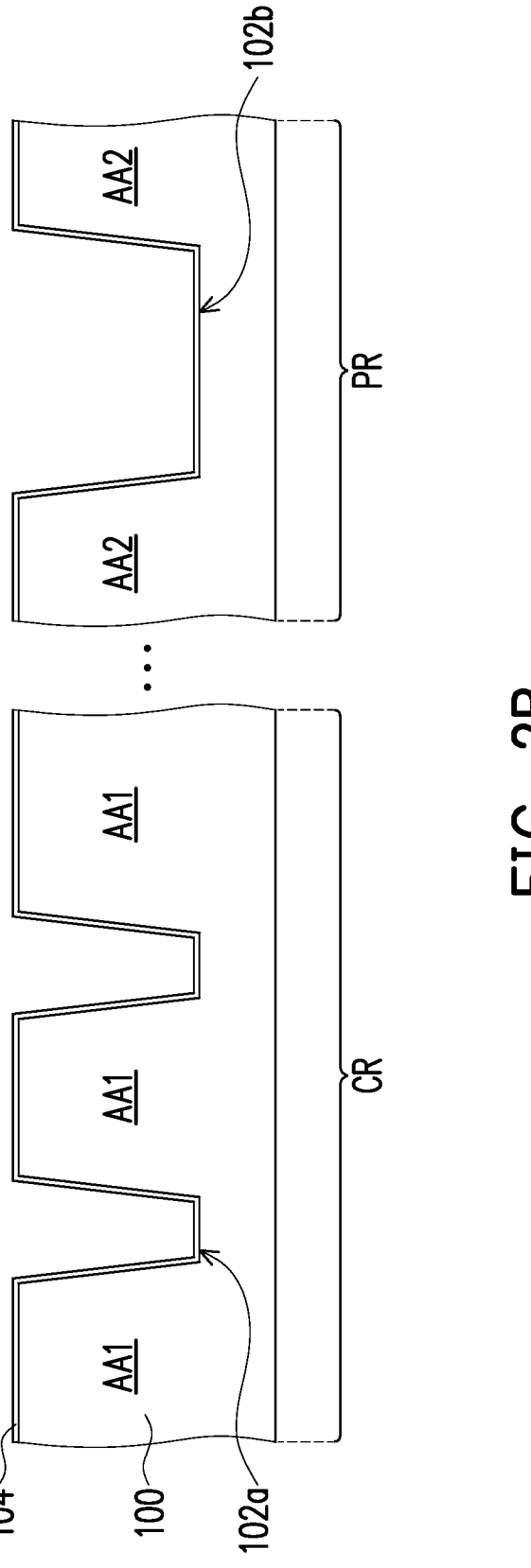

Referring to FIG. 1 and FIG. 2B, step S104 is performed, and a lining layer 104 is formed on the substrate 100. The lining layer 104 globally and conformally covers the substrate 100. In other words, a topmost surface of the substrate 100 as well as surfaces of the trenches 102a, 102b are covered by the lining layer 104. The lining layer 104 may be formed of an insulating material, such as silicon oxide. In some embodiments, an oxidation process may be performed for oxidizing a skin portion of the substrate 100, so as to form the lining layer 104. In alternative embodiments, a deposition process (e.g., a chemical vapor deposition (CVD) process) may be performed to form the lining layer 104 on the substrate 100.

Figure 2C:
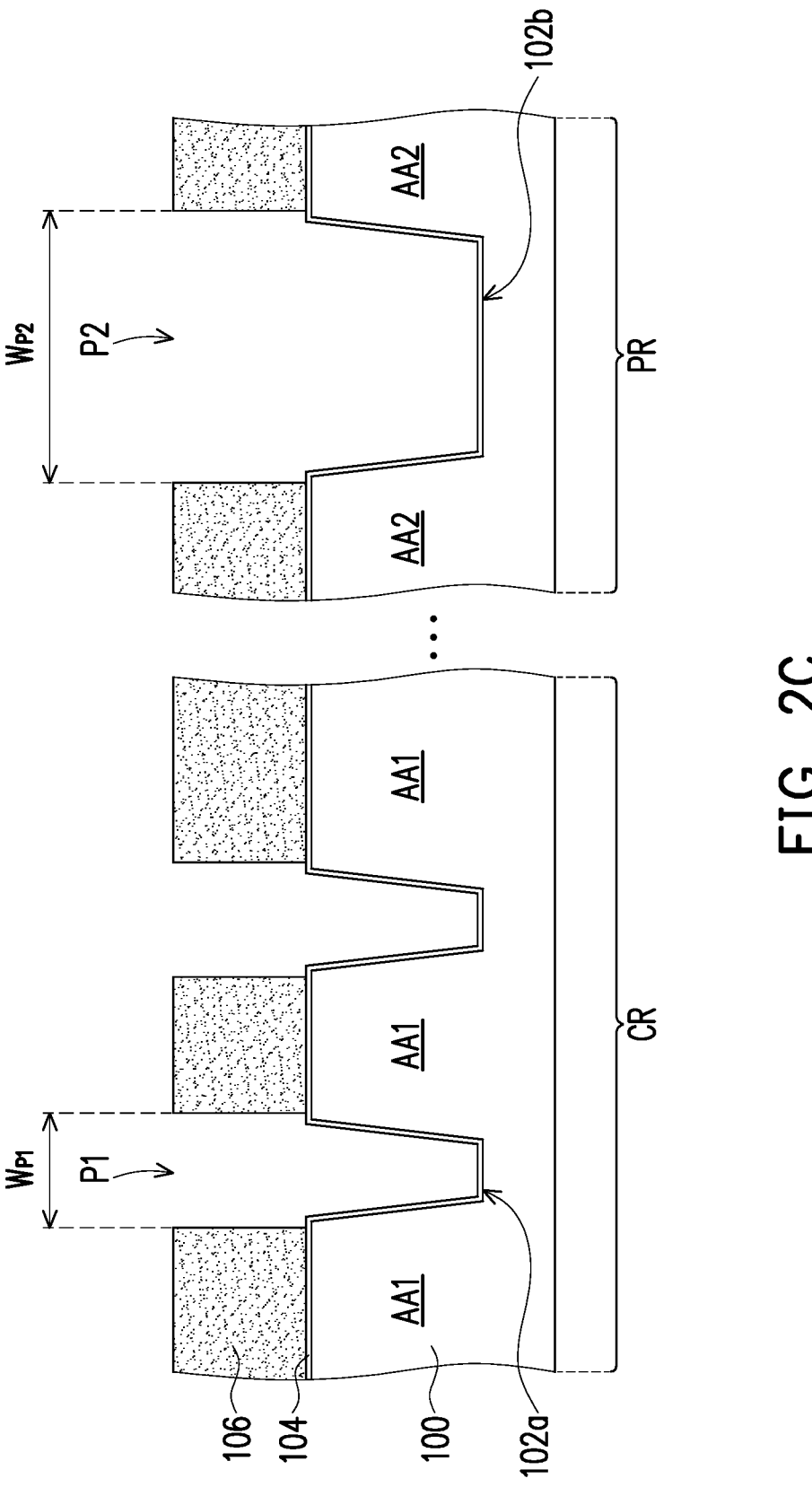

Referring to FIG. 1 and FIG. 2C, step S106 is performed, and a mask pattern 106 is formed on the topmost surface of the substrate 100. A body portion of the mask pattern 106 is located outside the trenches 102a, 102b, and the mask pattern 106 has openings P1, P2 communicating with the trenches 102a, 102b, respectively. In some embodiments, a width $W_{P1}$ of each opening P1 is greater than a maximum value of the width $W_{102a}$ of each trench 102a (as shown in FIG. 2B), and a width $W_{P2}$ of the opening P2 is greater than a maximum value of the width $W_{102b}$ of the trench 102b (as shown in FIG. 2B). In some embodiments, a material of the mask pattern 106 includes, but not limited to, silicon nitride.

Figure 2D:
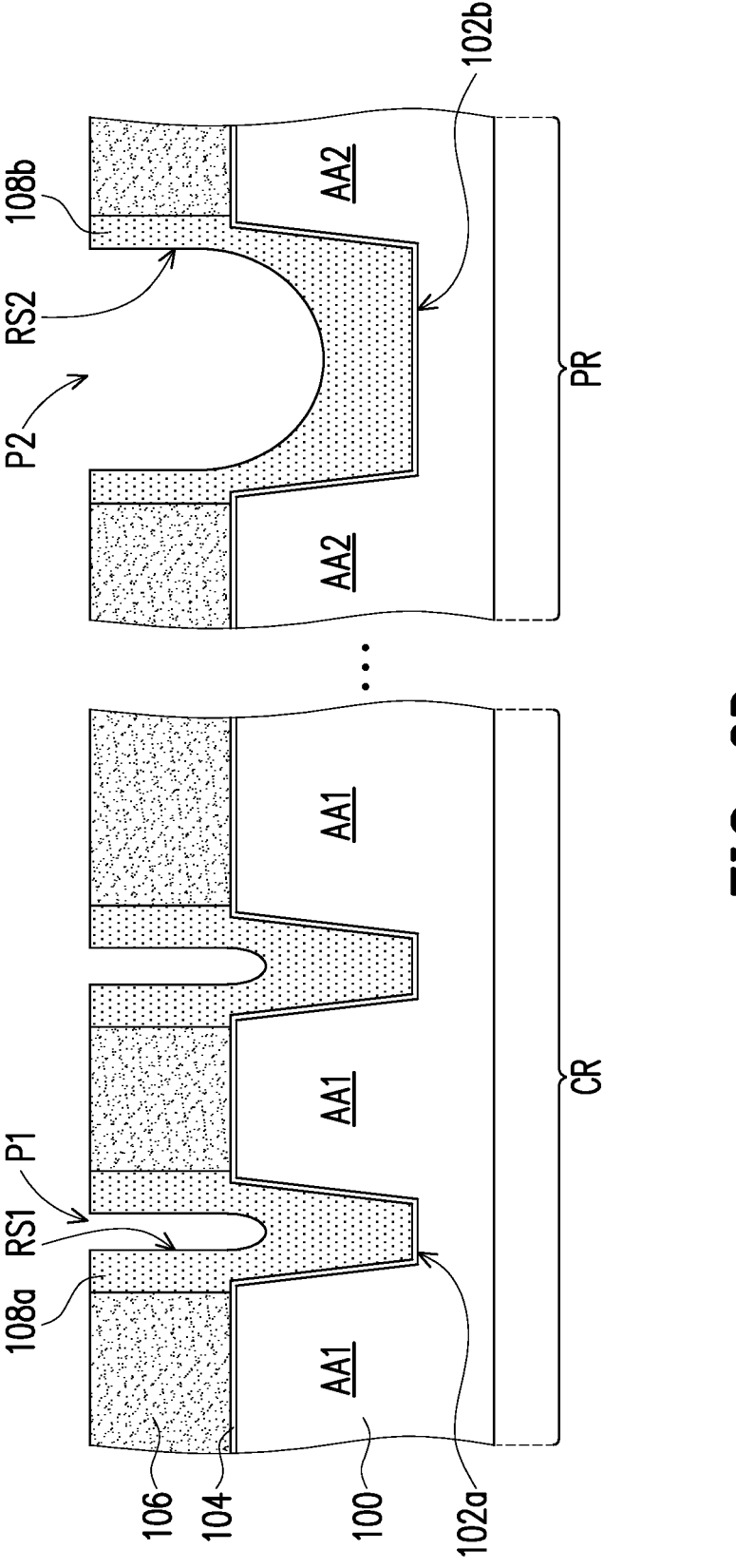

Referring to FIG. 1 and FIG. 2D, step S108 is performed, and first isolation material layers 108a and a first isolation material layer 108b are formed. The first material layers 108a are disposed in the trenches 102a and the openings P1, whereas the first isolation material layer 108b is disposed in the trench 102b and the opening P2. The first isolation material layers 108a cover sidewalls of the openings P1 but do not fill up the openings P1, and surfaces of the first isolation material layers 108a may define recesses RS1. Bottommost ends of the recesses RS1 may be slightly lower than, aligned with or slightly higher than the topmost surface of the substrate 100. Similarly, the first isolation material layer 108b covers a sidewall of the opening P2 but does not fill up the opening P2. In addition, since the trench 102b has a relatively large width (as compared to each of the trenches 102a), thus a bottommost end of a recess RS2 defined by the first isolation material layer 108b may be significantly lower than the topmost surface of the substrate 100. In other words, a depth of the recess RS2 may be greater than a depth of each of the recesses RS1. Further, since widths of the trench 102b and the opening P2 are significantly greater than widths of each trench 102a and each opening P1, a width of the recess RS2 may also be significantly greater than a width of each recess RS1. In some embodiments, the first isolation material layers 108a, 108b are formed of silicon oxide by, for example, an enhanced high aspect ratio process (eHARP). In addition, in some embodiments, a method for forming the first isolation material layers 108a, 108b may include a deposition process and a planarization process. The deposition process for forming the first isolation material layers 108a, 108b may be a CVD process, such as an enhanced high aspect ratio gap filling process.

Figure 2E:
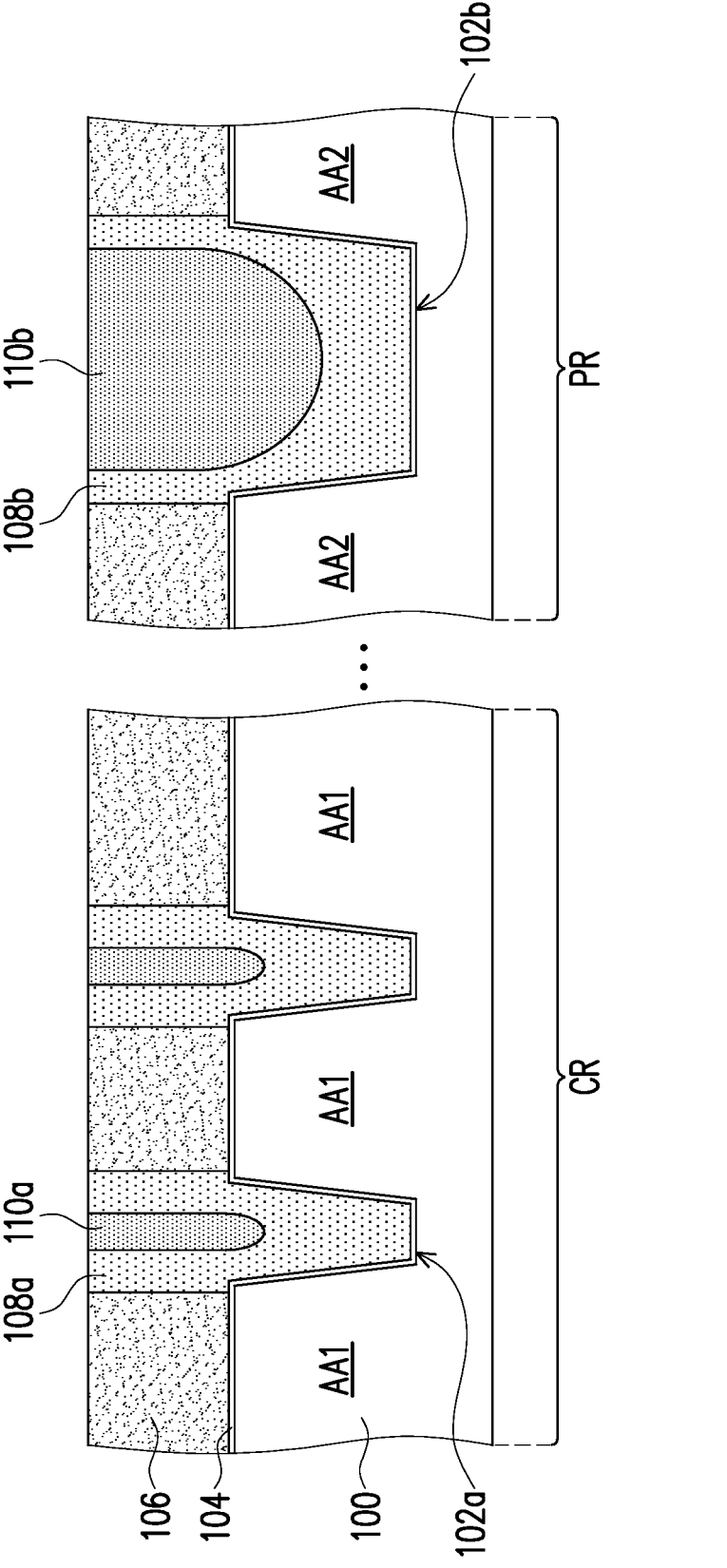

Referring to FIG. 1, FIG. 2D and FIG. 2E, step S110 is performed, and second isolation material layers 110a, 110b are respectively filled in the recesses RS1, RS2 defined by the first isolation material layers 108a, 108b. The second isolation material layers 110a may fill up the recesses RS1, while the second isolation material layer 110b may fill up the recess RS2. In some embodiments, the second isolation material layers 110a, 110b may be formed of silicon oxide (e.g., spin-on-glass (SOG)). In these embodiments where the second isolation material layers 110a, 110b are formed of SOG, fluid silicon oxide material may be filled in the recesses RS1, RS2 by a spin coating process, and solvent in the fluid silicon oxide material may be removed by a curing process, such that the fluid silicon oxide material can be solidified. Subsequently, portions of the solid silicon oxide material above a top surface of the mask pattern 106 may be removed by a planarization process (e.g., a CMP process). Portions of the solid silicon oxide material remained in the recesses RS1 form the second isolation material layers 110a, while a portion of the solid silicon oxide material remained in the recess RS2 forms the second isolation material layer 110b. Since the width of each recess RS1 is significantly shorter than the width of the recess RS2, solvent in the fluid silicon oxide material in the recesses RS1 is relatively difficult to be completely removed during the curing process. In a subsequent etching process, etchants may be more likely to travel along the interfaces between the first and second isolation material layers 108a, 110a, thus an etching rate of the second isolation material layers 110a may be slightly greater than an etching rate of the second isolation material layer 110b.

Figure 2F:
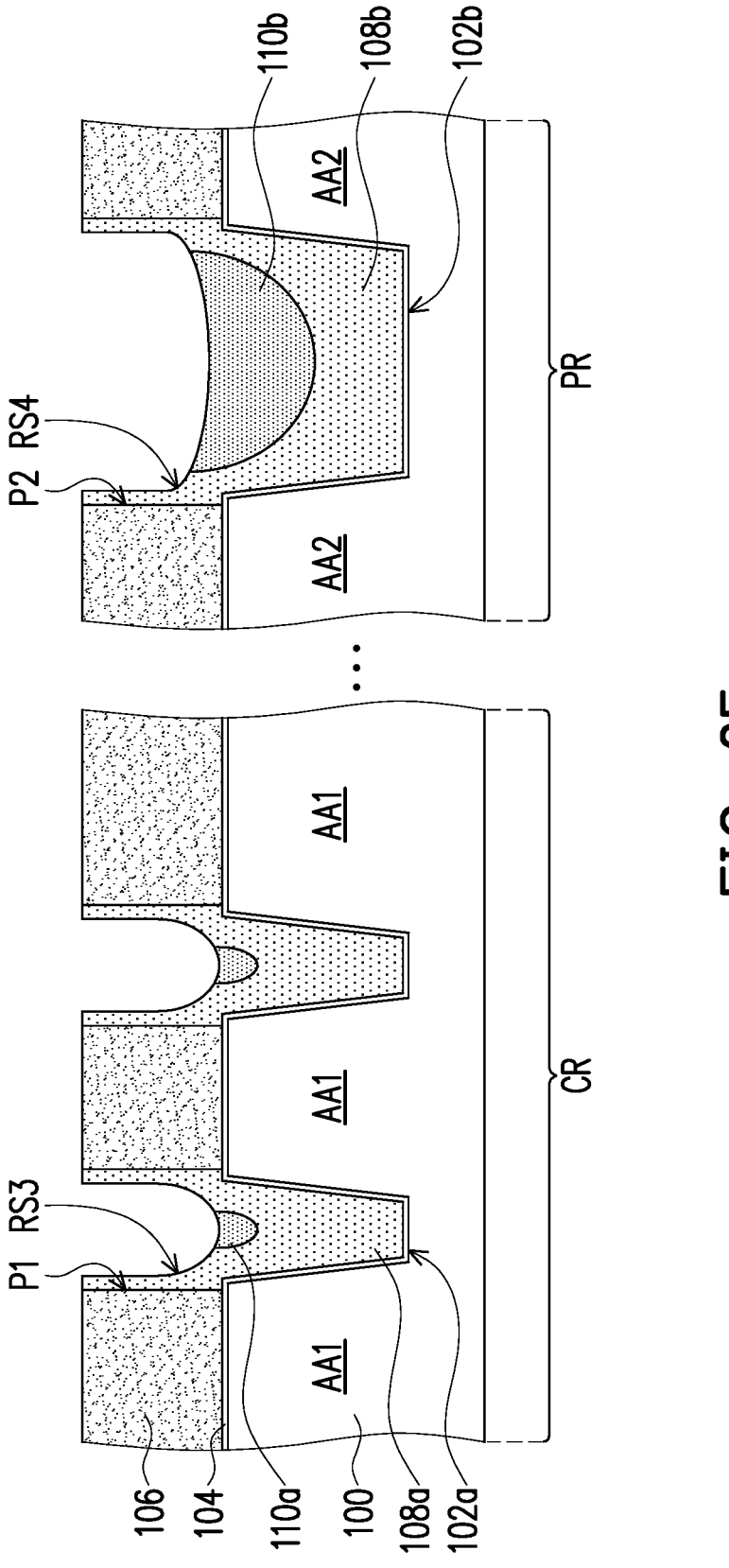

Referring to FIG. 1 and FIG. 2F, step S112 is performed, and first and second isolation material layers 108a, 110a as well as the first and second isolation material layers 108b, 110b are partially removed. Consequently, recesses RS3 extending downwardly from topmost surfaces of the first isolation material layers 108a and top surfaces of the second isolation material layers 110a are formed, and a recess RS4 extending downwardly from a topmost surface of the first isolation material layer 108b and a top surface of the second isolation material layer 110b is formed. In other words, upper portions of the first and second isolation material layers 108a, 110a are removed, and upper portions of the first and second isolation material layers 108b, 110b are removed. A width of each recess RS3 is slightly shorter than a width of each opening P1 of the mask pattern 106, and portions of the first isolation material layers 108a may still cover sidewalls of the mask pattern 106 and define sidewalls of the recesses RS3. Similarly, a width of the recess RS4 is slightly shorter than a width of the opening P2 of the mask pattern 106, and a portion of the first isolation material layer 108b may still cover a sidewall of the mask pattern 106 and define a sidewall of the recess RS4. Furthermore, bottommost ends of the recesses RS3, RS4 are higher than the topmost surface of the substrate 100, so as to prevent from possible damages on the active regions AA1, AA2 during formation of the recesses RS3, RS4. In some embodiments, a method for forming the recesses RS3, RS4 may include an isotropic etching process (e.g., a wet etching process). Since an etching rate of the second isolation material layers 110a is higher than an etching rate of the second isolation material layer 110b (as described with reference to FIG. 2E), thus a depth of each recess RS3 may be greater than a depth of the recess RS4. In those embodiments where the first isolation material layers 108a, 108b are formed of eHARP silicon oxide and the second isolation material layers 110a, 110b are formed of SOG, an etching rate of the first isolation material layers 108a, 108b is slightly lower than an etching rate of the second isolation material layers 110a, 110b. Accordingly, portions of the first and second isolation material layers 108a, 108b are remained, and cover sidewalls of the mask pattern 106.

Figure 2G:
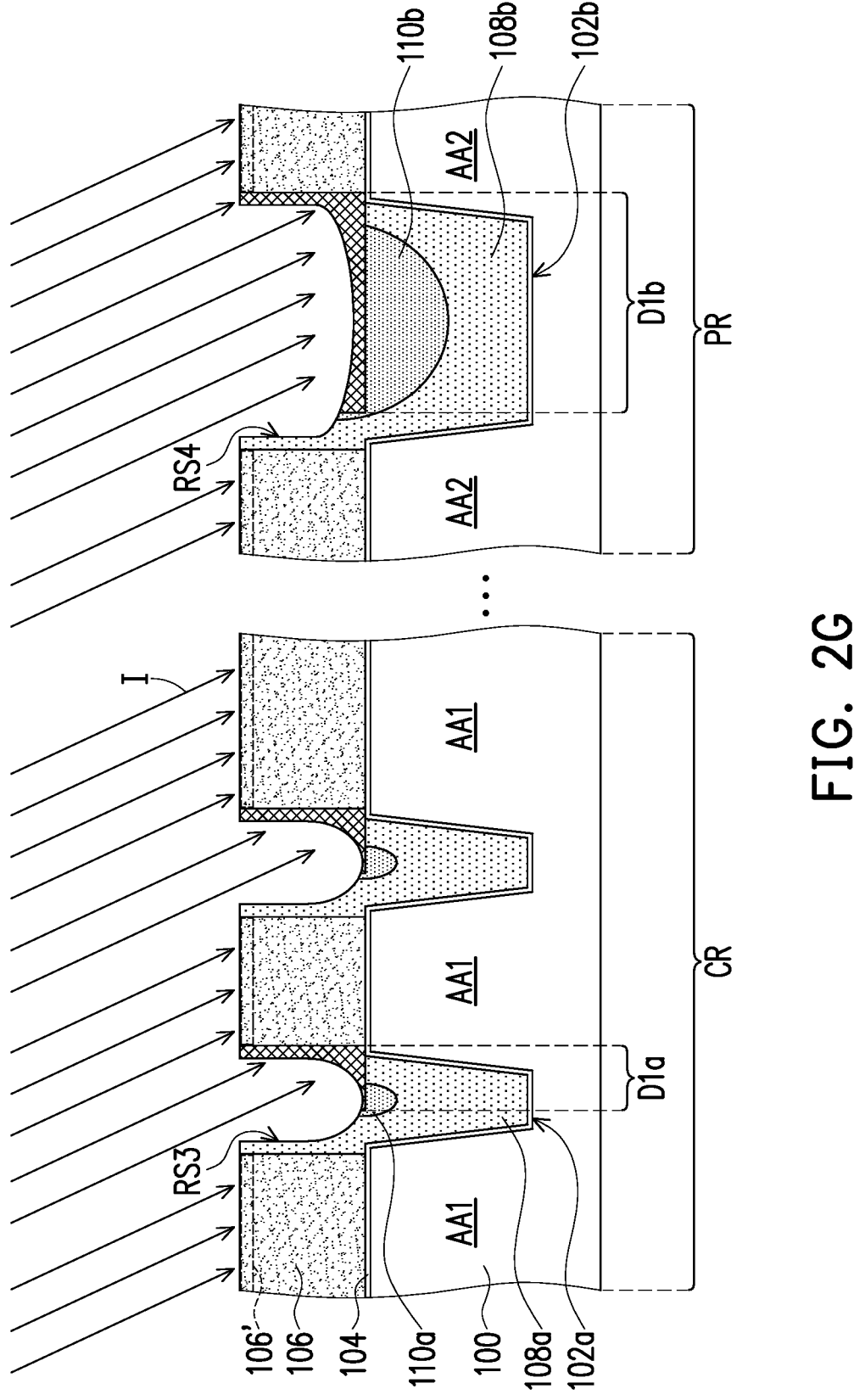

Referring to FIG. 1 and FIG. 2G, step S114 is performed, and a first ion implantation process is performed. During the first ion implantation process, ions I obliquely strike from, for example, left side. Consequently, portions of the first and second isolation material layers 108a, 110a exposed at right halves of the recesses RS3 are implanted by the ions I, while portions of the first and second isolation material layers 108a, 110a exposed at left halves of the recesses RS3 are shielded from ion implantation by the mask pattern 106. The portions of the first and second isolation material layers 108a, 110a being implanted by the ions I are damaged, so as to form first damage regions D1a having a relatively high etching rate (as compared to the portions of the first and second isolation material layers 108a, 110a not being damaged by the ions I). Similarly, at the recess RS4, portions of the first isolation material layers 108b, 110b not being shielded by the mask pattern 106 are implanted by the ions I, and form a first damage region D1b having a relatively high etching rate. Since the recess RS4 is wider than each recess RS3, the portion of the recess RS4 not being shielded is larger than the portion of each recess RS3 not being shielded. Thus, the first damage region D1b is larger than each first damage region D1a. In addition, by controlling depth of the ion implantation treatment, bottommost ends of the first damage regions D1a, D1b may be slightly higher than, aligned with or slightly lower than the topmost surface of the substrate 100. On the other hand, a skin portion of the mask pattern 106 may be implanted by the ions I, and forms a damage region 106' having a relatively high etching rate. In those embodiments where the first and second isolation material layers 108a, 108b, 110a, 110b are formed of silicon oxide and a semiconductor material of the substrate 100 is silicon, an atomic number of the element of the ions I is greater than an atomic number of oxygen, but smaller than an atomic number of silicon. Thereby, the ions I may be implanted into the first and second isolation material layers 108a, 108b, 110a, 110b, but may not damage the active regions AA1, AA2 in the substrate 100.

Figure 2H:
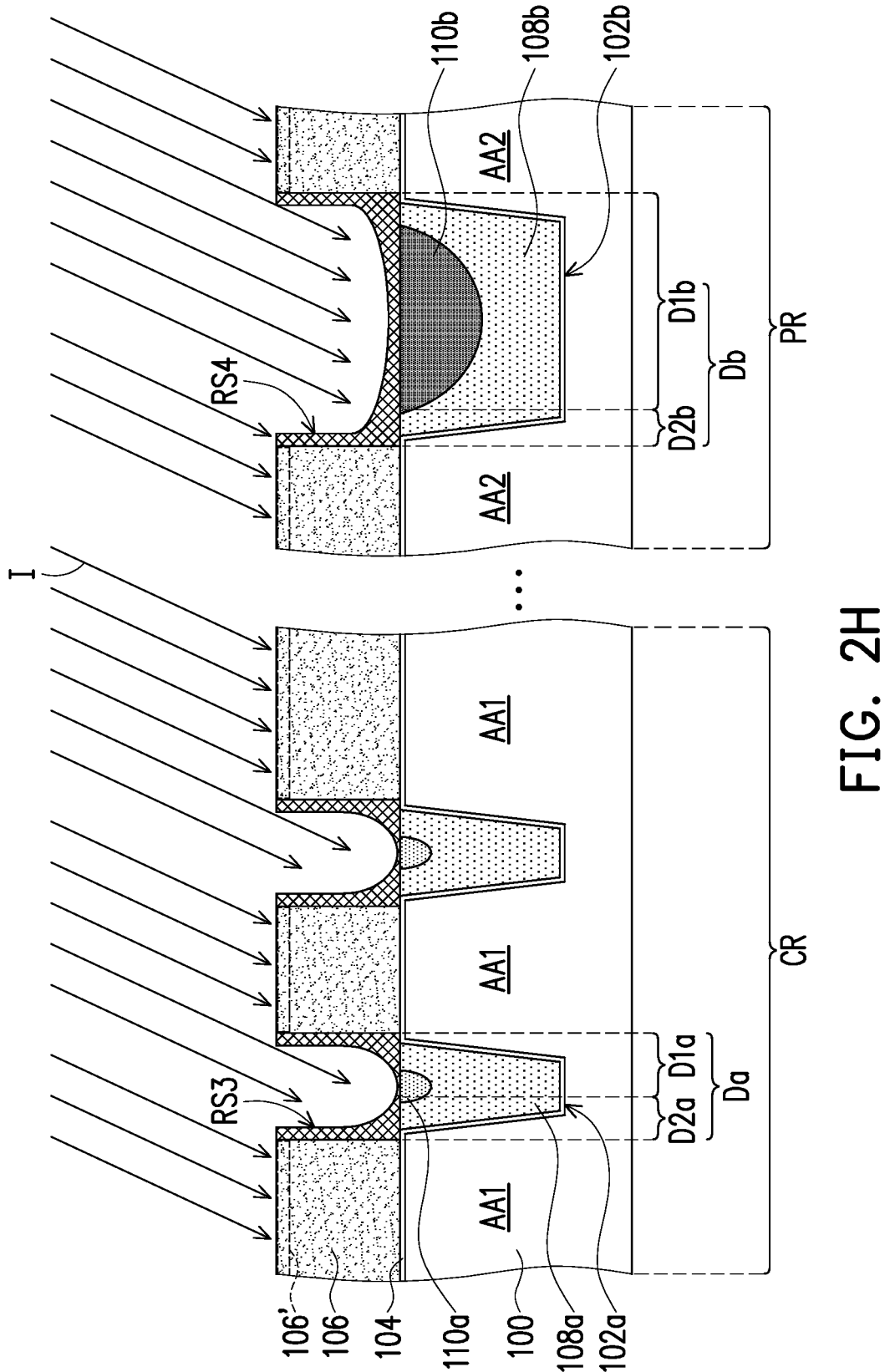

Referring to FIG. 1 and FIG. 2H, step S116 is performed, and a second ion implantation process is performed. During the second ion implantation process, the ions I obliquely strike from, for example, right side. Consequently, portions of the first and second isolation material layers 108a, 110a exposed at left halves of the recesses RS3 are implanted by the ions I, and form second damage regions D2a having a relatively high etching rate (as compared to the portions of the first and second isolation material layers 108a, 110a not being damaged by the ions I). On the other hand, at the recess RS4, portions of the first and second isolation material layers 108b, 110b not being shielded by the mask pattern 106 are implanted by the ions I, and form a second damage region D2b. By controlling depth of the ion implantation treatment, bottommost ends of the second damage regions D2a, D2b may be slightly higher than, aligned with or slightly lower than the topmost surface of the substrate 100. The first damage regions D1a formed during the first ion implantation process may be connected with the second damage regions D2a formed during the second ion implantation process, to form continuously extending damage regions Da. Similarly, the first damage region D1b formed during the first ion implantation process may be connected with the second damage region D2b formed during the second ion implantation process, to form a continuously extending damage region Db. Moreover, in those embodiments where the lining layer 104 is formed by an oxidation process, the lining layer 104 has a relatively dense structure, and can be prevented from being damaged by the ions I during the first and second ion implantation processes. Therefore, the active regions AA1, AA2 can be further protected. In some embodiments, the first and second ion implantation processes use the same ions. In addition, during each of the first and second ion implantation processes, an angle between an incident direction of the ions I and a vertical direction may range from 50° to 80°.

Figure 2I:
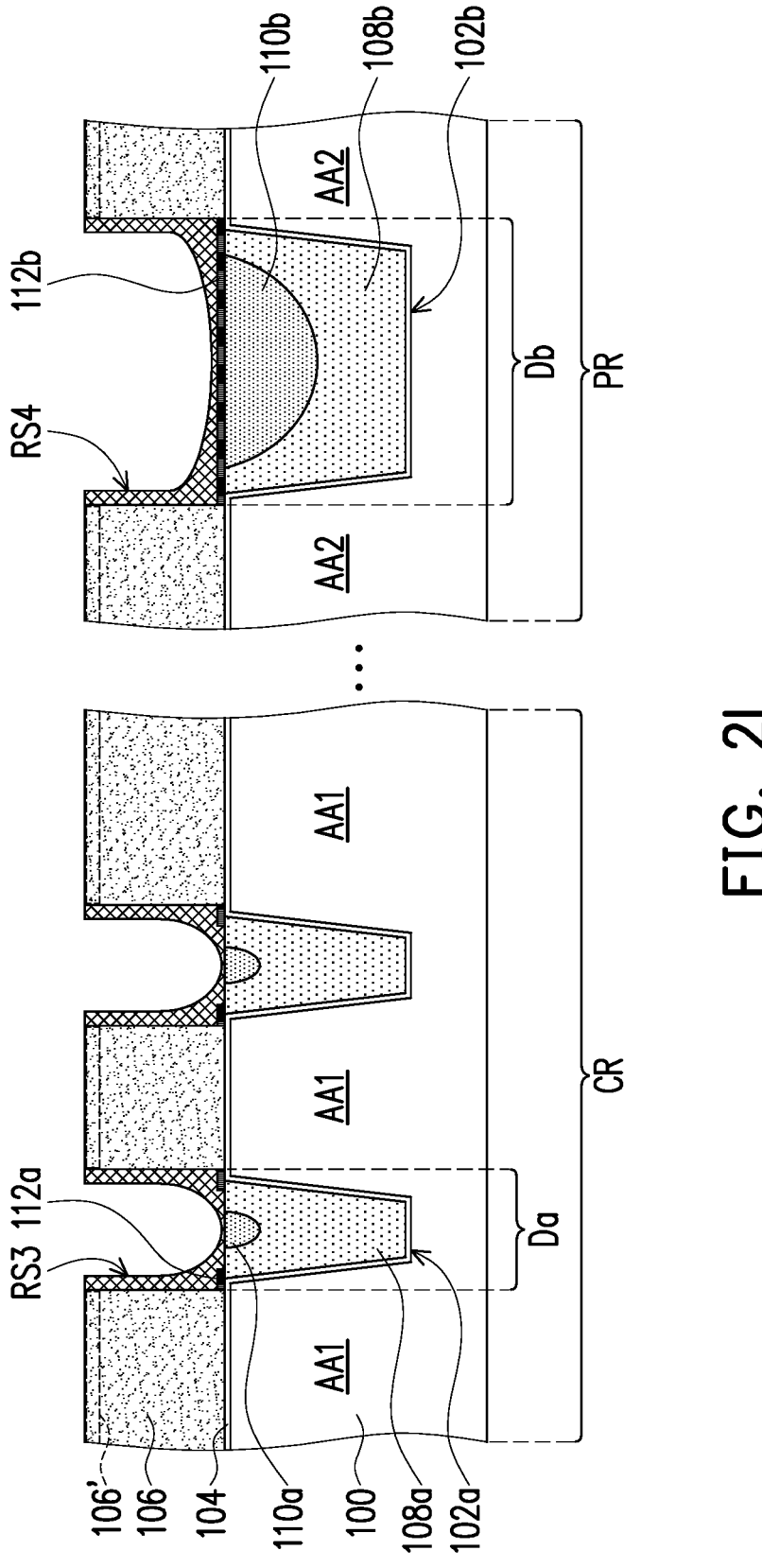
Figure 2J:
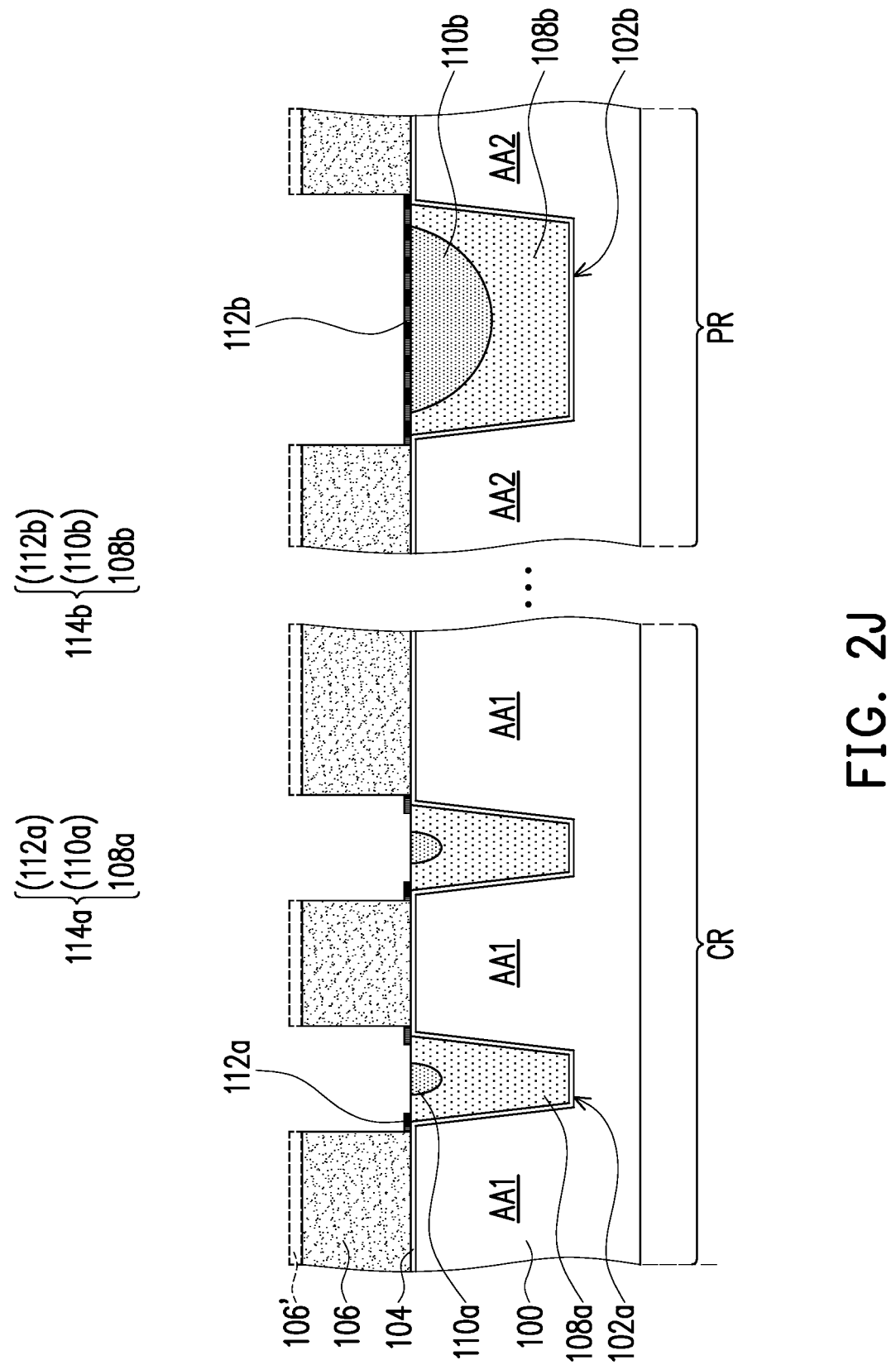

Referring to FIG. 1 and FIG. 2I, step S118 is performed, and some portions of the damage regions Da, Db are transformed into protection layers 112a, 112b. As compared to the damage regions Da, Db, the protection layers 112a, 112b are formed as a relatively dense structure, and are slightly different from the damage regions Da, Db in terms of composition. Therefore, the protection layers 112a, 112b has etching selectivity with respect to the damage regions Da, Db. Formation of the protection layers 112a, 112b may be resulted from reaction of the ions used in first and second ion implantation processes (i.e., the ions I as shown in FIG. 2G and FIG. 2H) and target material layers (i.e., the first isolation material layers or the first and second isolation material layers). Accordingly, the reaction may occur at locations with high concentration of the implanted ions. In regarding the relatively narrow recesses RS3, the regions with high concentration of the implanted ions are at lower left and lower right sides of each recess RS3. On the other hand, in regarding the relatively wide recess RS4, the region with high concentration of the implanted ions spans at bottom side of the recess RS4. In some embodiments, the reaction of the implanted ions and the target material layers is induced by a decoupled plasma treatment. In these embodiments, the reaction is likely to occur at bottom portions of the target material layers, rather than skin portions of the target material layers. In regarding the recesses RS3, the protection layers 112a are formed on edges of the trenches 102a, and cover portions of the active regions AA1 located between the mask pattern 106 and the trenches 102a. As a result, the protection layers 112a may protect the active regions AA1 in a subsequent etching step. In addition, the protection layers 112a may further extend to top of the trenches 102a from outside of the trenches 102a, and cover portions of the first isolation material layers 108a. On the other hand, in regarding the recess RS4, the protection layer 112b continuously extends above the trench 102b, and extends onto edges of the trench 102b. Thereby, the protection layer 112b covers the first isolation material layer 108b and the second isolation material layer 110b in the trench 102b, and covers portions of the active regions AA2 located between the mask pattern 106 and the trench 102b. Thus, the protection layer 112b may protect the active regions AA2 in a subsequent etching step. In those embodiments where the implanted ions include nitrogen, the protection layers 112a, 112b may be formed by performing a decoupled plasma nitridation (DPN) treatment. The protection layers 112a, 112b formed by a DPN treatment may include silicon oxynitride, when the first isolation material layers (the first isolation material layers 108a, 108b) and the second isolation material layers (the second isolation material layers 110a, 110b) are formed of silicon oxide. On the other hand, the damage regions Da, Db may mainly include silicon oxide, and may or may not be lightly doped with nitrogen. In some embodiments, a process temperature of the decoupled plasma treatment ranges from about 550° C. to about 750° C., and a process time of the decoupled plasma treatment ranges from about 0.5 minute to about 1 minute.

Referring to FIG. 1 and FIG. 2J, step S120 is performed, and the damage regions Da, Db are removed. After removal of the damage regions Da, Db, the protection layers 112a, 112b as well as portions of the first isolation material layers 108a not being damaged by the ion implantation are exposed. The protection layers 112a and remained portions of the first isolation material layers 108a may be collectively functioned as isolation structures 114a in the memory cell region CR. On the other hand, the protection layer 112b and remained portion of the first isolation material layer 108b may be collectively functioned as an isolation structure 114b in the peripheral circuit region PR. In some embodiments, the isolation structures 114a in the memory cell region CR may further include remained portions of the second isolation material layers 110a, and the isolation structure 114b in the peripheral circuit region PR may further include the remained portion of the second isolation material layer 110b. A method for removing the damage regions Da, Db may include performing an isotropic etching process (e.g., a wet etching process). As compared to protection layers 112a, 112b, the damage regions Da, Db is more susceptible to etching because of structural damages. Further, as a result of the decoupled plasma treatment, composition of the protection layers 112a, 112b are slightly different from composition of the damage regions Da, Db, thus etching selectivity between the protection layers 112a, 112b and the damage regions Da, Db can be enhanced. Accordingly, the protection layers 112a, 112b may at least partially remain while removing the damage regions Da, Db, and the lining layer 104 and the active regions AA1, AA2 covered by the protection layers 112a, 112b can be protected. In certain embodiments, the protection layers 112a, 112b are removed along with the damage regions Da, Db. Nevertheless, etching rate of the protection layers 112a, 112b may still be lower than etching rate of the damage regions Da, Db, such that the active regions AA1, AA2 may still be protected by the protection layers 112a, 112b during the etching process. On the other hand, the damage region 106' of the mask pattern 106 may be removed during removal of the damage regions Da, Db. In addition, other portions of the mask pattern 106 may not be subjected to implantation damages, and have etching selectivity with respect to the first and second isolation material layers, thus can be remained.

Figure 3:
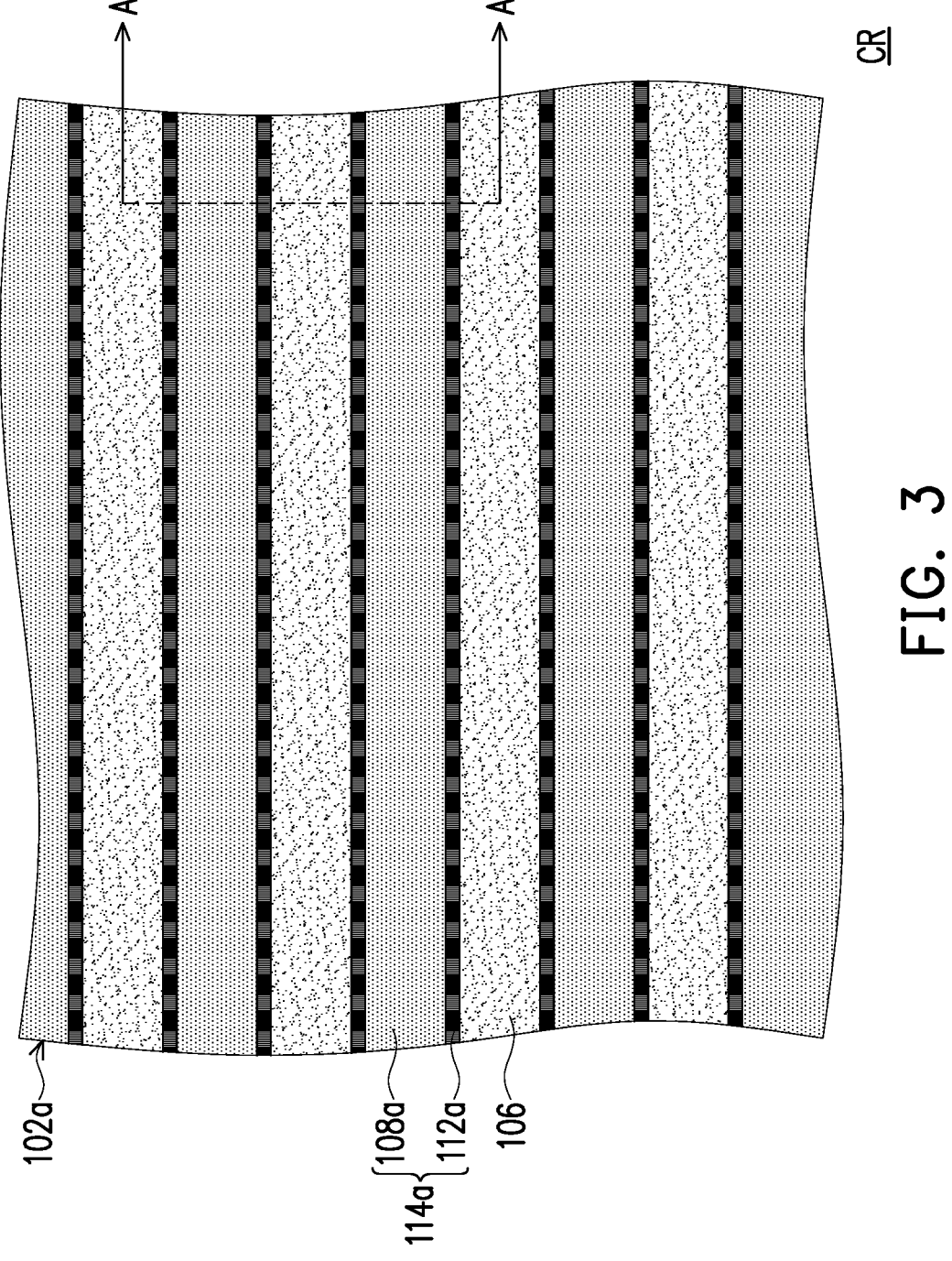
FIG. 3 is a schematic plan view illustrating the isolation structures and the mask pattern in a memory cell region according to some embodiments of the present disclosure.

FIG. 3 is a schematic plan view illustrating the isolation structures 114a and the mask pattern 106 in a memory cell region CR according to some embodiments of the present disclosure. It should be noted that, the second isolation material layers 110a in the isolation structures 114a are omitted from illustration. In addition, the schematic cross-sectional view of FIG. 2J may be a schematic cross-sectional view along line A-A' in FIG. 3.

Referring to FIG. 2J and FIG. 3, in those embodiments where the active regions AA1 are in stripe shapes, the trenches 102a for defining the active regions AA1 may also be in stripe shapes (or having stripe portions), and the mask pattern 106 has stripe portions covering the active regions AA1. In these embodiments, the protection layers 112a between the mask pattern 106 and the trenches 102a are in stripe shapes as well.

Figure 4:
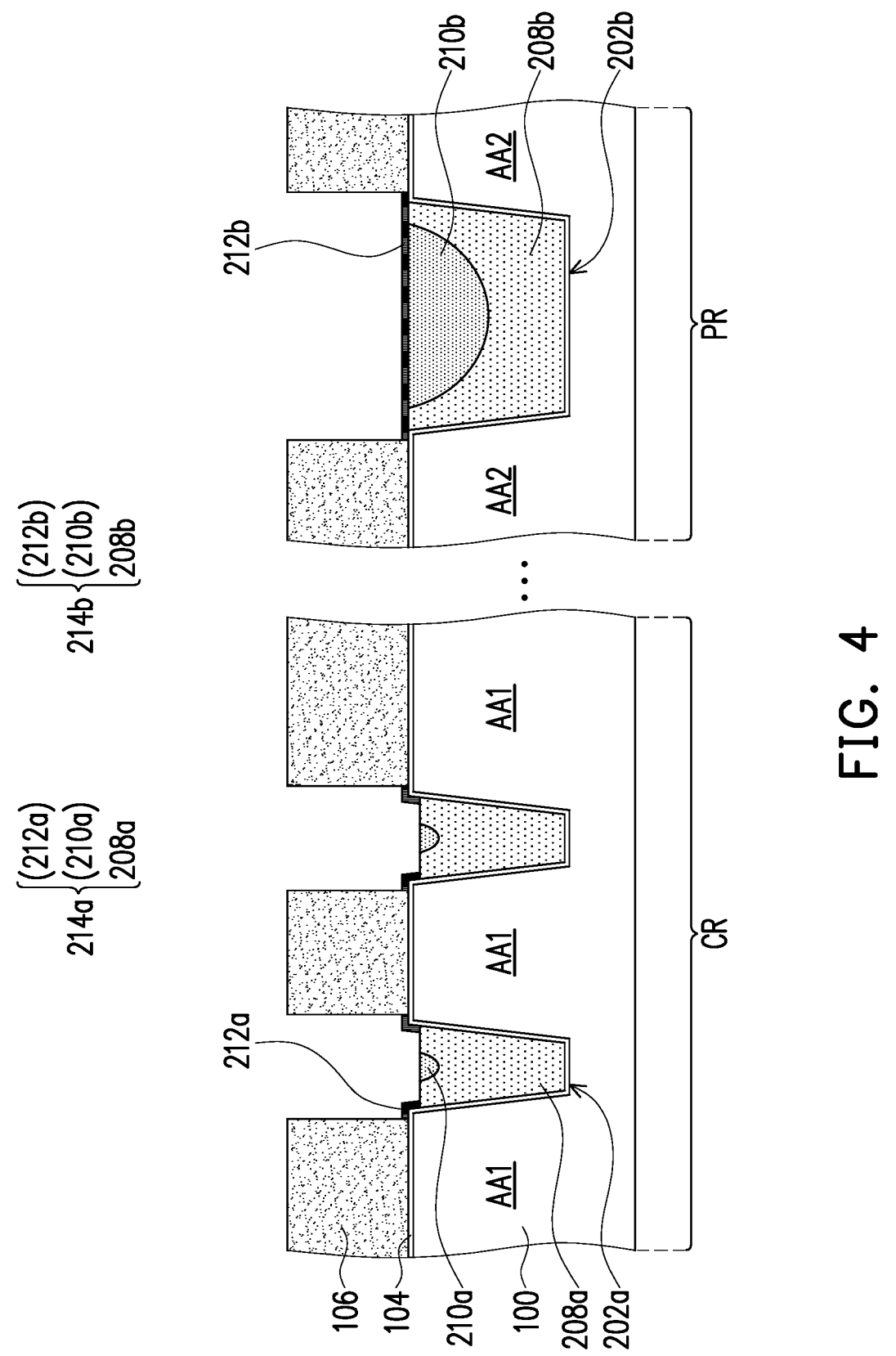
FIG. 4 is a schematic cross-sectional view illustrating isolation structures according to some embodiments of the present disclosure.

FIG. 4 is a schematic cross-sectional view illustrating isolation structures 214a, 214b according to some embodiments of the present disclosure. The isolation structures 214a, 214b shown in FIG. 4 are similar to the isolation structures 114a, 114b as shown in FIG. 2J. Only differences between the isolation structures 214a, 214b and the isolation structures 114a, 114b will be described, the same or the like parts would not be repeated again. In addition, the like numerical references indicate the same or similar components.

Referring to FIG. 4, the isolation structures 214a include first isolation material layers 208a and protection layers 212a, while the isolation structure 214b includes a first isolation material layer 208b and a protection layer 212b. In some embodiments, the isolation structures 214a further include second isolation material layers 210a, and the isolation structure 214b further includes a second isolation material layer 210b. Top surfaces of the first isolation material layers 208a (or top surfaces of the first isolation material layers 208a and the second isolation material layers 210a) are lower than the topmost surface of the substrate 100. On the other hand, a top surface of the first isolation material layer 208b (or top surfaces of the first and second isolation material layers 208b, 210b) is substantially coplanar with the topmost surface of the substrate 100. During the step as described with reference to FIG. 2F, the second isolation material layers 210a in the memory cell region CR have a relatively high etching rate (as compared to the second isolation material layer 210b in the peripheral circuit region PR), such that bottommost ends of the formed recesses RS3 may be much lower than bottommost end of the recess RS4. Accordingly, during the steps as described with reference to FIG. 2G and FIG. 2H, bottommost surfaces of the damage regions Da may be lower than the topmost surface of the substrate 100, and a bottommost surface of the damage region Db may be substantially coplanar with the topmost surface of the substrate 100. Subsequently, during the step as described with reference to FIG. 2I, the formed protection layers 212 may extend from the top surfaces of the first isolation material layers 208a onto the topmost surface of the substrate 100 along sidewalls of the trenches 102a. On the other hand, the protection layer 212b covers the top surface of the first isolation material layer 208b (or top surfaces of the first and second isolation material layers 208b, 210b), and extends onto the topmost surface of the substrate 100. In other words, the protection layers 112a shown in FIG. 2I and FIG. 2J merely cover portions of the active regions AA1 located between edges of the trenches 102a and the mask pattern 106, and may not extend to sidewalls of the active regions AA1. On the other hand, the protection layers 212a shown in FIG. 4 further extend to sidewalls of the active regions AA1, and completely cover top corners of the active regions AA1.

Figure 5A:
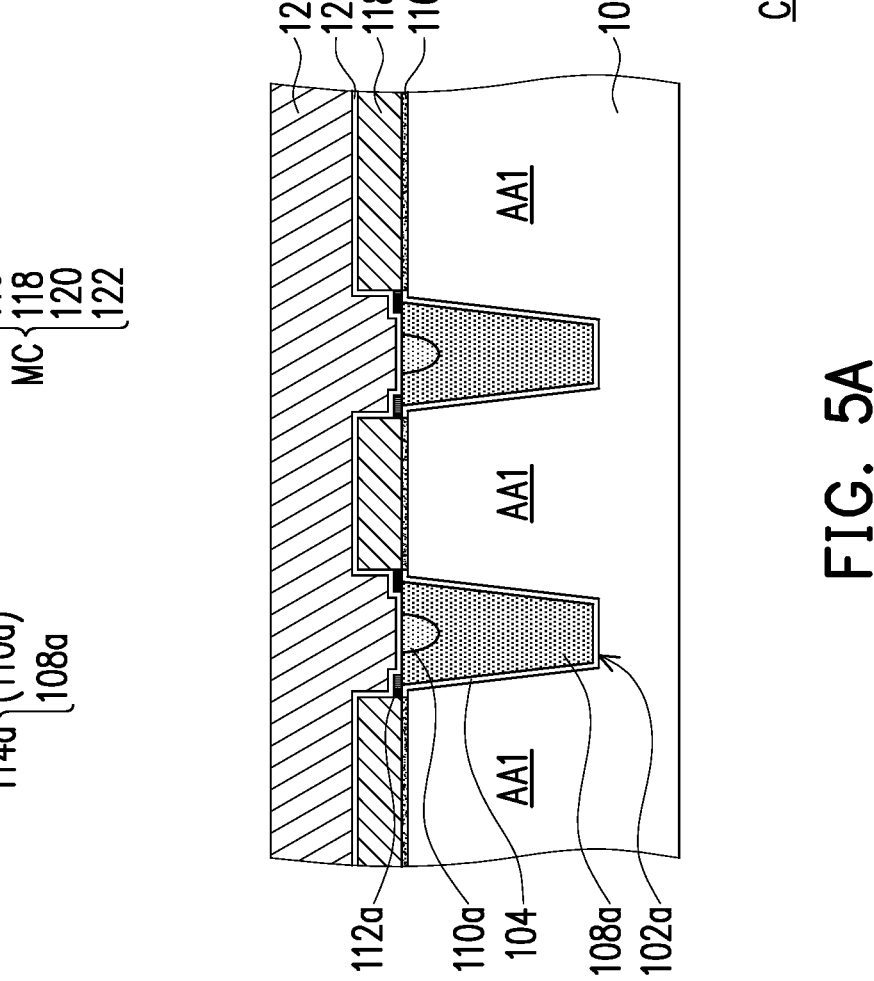
FIG. 5A is a schematic cross-sectional view illustrating memory devices formed in a memory cell region according to some embodiments of the present disclosure.
Figure 5B:
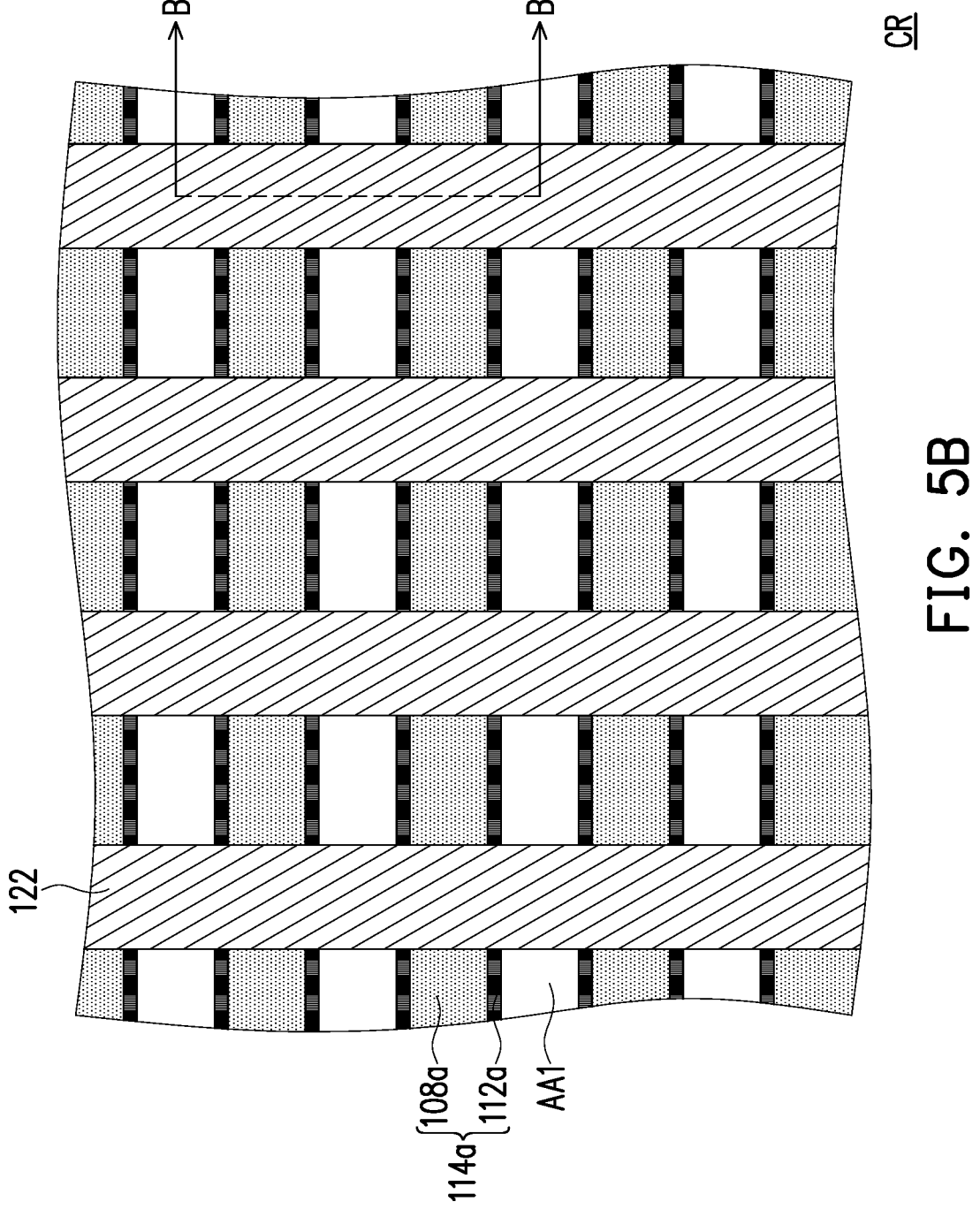
FIG. 5B is a schematic plan view illustrating memory devices formed in a memory cell region according to some embodiments of the present disclosure.

FIG. 5A is a schematic cross-sectional view illustrating memory devices MC formed in the memory cell region MC according to some embodiments of the present disclosure. FIG. 5B is a schematic plan view illustrating memory devices MC formed in the memory cell region MC according to some embodiments of the present disclosure. It should be noted that, the second isolation material layers 110a as shown in FIG. 2J are omitted in FIG. 5B, and the schematic cross-sectional view of FIG. 5A may be a schematic cross-sectional view along line B-B' in FIG. 5B.

Referring to FIG. 5A and FIG. 5B, after formation of the isolation structures (e.g., the isolation structures 114a, 114b as shown in FIG. 2J), the mask pattern 106 may be removed, and memory devices MC (or referred as memory cells) may be formed on the active regions AA1. The memory devices MC respectively include a gate structure. The gate structure may include a tunneling dielectric layer 116, a floating gate 118, an inter-gate dielectric layer 120 and a control gate 122. A method for forming the gate structures may include removing some portions of the lining layer 104, to expose the active regions AA1. Subsequently, the tunneling dielectric layers 116 and the floating gates 118 are formed on the exposed active regions AA1. Thereafter, the inter-gate dielectric layers 120 and the control gates 122 are formed. The control gates 122 and the underlying inter-gate dielectric layers 120 may extend along a direction intersected with an extending direction of the active regions AA1. Thereby, the inter-gate dielectric layers 120 and the control gates 122 may cover some portions of the isolation structures 114a. In some embodiments, after formation of the memory devices MC, the protection layers 112a may remain, and may be partially covered by the inter-gate dielectric layers 120 and the control gates 122. In alternative embodiments, the protection layers 112 are removed during formation of the memory devices MC. On the other hand, the tunneling dielectric layers 116 and the floating gates 118 may be located between the control gates 122 and the active regions AA1, and may not cover the isolation structures 114a. In embodiments described with reference to FIG. 5A and FIG. 5B, the memory devices MC (or referred as memory cells) may be flash memory devices. Further, by adjusting configuration of signal lines connected to the memory devices MC, a NAND flash memory circuit or a NOR flash memory circuit can be formed. Moreover, the isolation structures 114a as shown in FIG. 5A may be alternatively replaced by the isolation structures 214a as shown in FIG. 4.

As above, two etching processes are performed to adjust height of the isolation material layers, to form the trench isolation structures. During the first etching process, top surfaces of the isolation material layers are adjusted to be slightly higher than a topmost surface of the substrate. Before the second etching process, a left and a right oblique ion implantation processes are performed to form damage regions in the isolation material layers. An etching rate of the damage regions is higher than an etching rate of other portions of the isolation material layers. Further, some portions of the damage regions are transformed into dense protection layers by a decoupled plasma treatment. The protection layers are located at bottoms of the damage regions, and cover top corners of the active regions. In addition, an etching rate of the protection layers may be lower than an etching rate of other portions of the damage regions. During the second etching process, the damage regions are removed, and the isolation structures are formed. Since the etching rate of the protection layers is lower than the etching rate of other portions of the damage regions, the protection layers can protect the top corners of the active regions during removal of the damage regions, so as to prevent etchants from entering the active regions from these top corners. Therefore, compromise on performance of the electronic devices subsequently formed on the active regions can be avoided.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:
1. An isolation structure, comprising:
an isolation material layer, filled in a trench of a substrate, wherein the isolation material layer comprises a first isolation material layer and a second isolation material layer, a surface of the first isolation material layer has a recess, and the second isolation material layer fills up the recess; and
a protection layer, having two portions extending along a horizontal direction of a topmost surface of the substrate, from the topmost surface of the substrate to a top surface of the isolation material layer across boundaries of the trench, and covering opposite edges of the isolation material layer, wherein the two portions of the protection layer are laterally spaced apart from each other, and the protection layer has an etching selectivity with respect to the isolation material layer.
2. The isolation structure according to claim 1, wherein the protection layer further covers sidewalls of the trench, and the top surface of the isolation material layer is lower than the topmost surface of the substrate.

3. The isolation structure according to claim 1, wherein the first isolation material layer and the second isolation material layer are formed of silicon oxide, and the protection layer is formed of silicon oxynitride.

4. The isolation structure according to claim 1, further comprising a lining layer, conformally covers the topmost surface of the substrate, wherein a portion of the lining layer is covered by the isolation material layer and the protection layer.

5. The isolation structure according to claim 1, wherein all of the top surface of the isolation material layer is lower than the topmost surface of the substrate.

6. The isolation structure according to claim 1, wherein a bottommost end of the recess is slightly lower than, aligned with or slightly higher than the topmost surface of the substrate.

7. A memory device, comprising:

an isolation structure, comprising:

an isolation material layer, filled in a trench of a substrate; and a protection layer, having two portions extending along a horizontal direction of a topmost surface of the substrate, from the topmost surface of the substrate to a top surface of the isolation material layer across boundaries of the trench, and covering opposite edges of the isolation material layer, wherein the two portions of the protection layer are laterally spaced apart from each other, and the protection layer has an etching selectivity with respect to the isolation material layer; and a gate structure, disposed on the substrate, and comprising:

a tunneling dielectric layer, lying on the substrate;

a floating gate, disposed on the tunneling dielectric layer;

an inter-gate dielectric layer, covering the floating gate, the protection layer and the isolation material layer; and a control gate, disposed on the inter-gate dielectric layer.

8. The memory device according to claim 7, wherein the protection layer further covers sidewalls of the trench, and the top surface of the isolation material layer is lower than the topmost surface of the substrate.

9. The memory device according to claim 7, wherein the isolation material layer comprises a first isolation material layer and a second isolation material layer, a surface of the first isolation material layer has a recess, and the second isolation material layer fills up the recess.

10. The memory device according to claim 9, wherein the first isolation material layer and the second isolation material layer are formed of silicon oxide, and the protection layer is formed of silicon oxynitride.

11. The memory device according to claim 9, wherein a bottommost end of the recess is slightly lower than, aligned with or slightly higher than the topmost surface of the substrate.

12. The memory device according to claim 7, further comprising a lining layer, conformally covers the topmost surface of the substrate, wherein a portion of the lining layer is covered by the isolation material layer and the protection layer.

13. The memory device according to claim 7, wherein all of the top surface of the isolation material layer is lower than the topmost surface of the substrate.

14. An isolation structure, comprising:

an isolation material layer, filled in a trench of a substrate, wherein the isolation material layer comprises a first isolation material layer and a second isolation material layer, a surface of the first isolation material layer has a recess, and the second isolation material layer fills up the recess; and a protection layer, having two portions covering opposite edges of the isolation material layer, wherein the two portions of the protection layer are laterally spaced apart from each other, extending respectively on a topmost surface of the isolation material layer, and extending along a horizontal direction of a topmost surface of the substrate, from the topmost surface of the substrate to a top surface of the isolation material layer across boundaries of the trench, and the protection layer has an etching selectivity with respect to the isolation material layer.

15. The isolation structure according to claim 14, wherein the protection layer further covers a topmost of the substrate.

16. The isolation structure according to claim 14, wherein the protection layer further covers sidewalls of the trench, and a top surface of the isolation material layer is lower than a topmost surface of the substrate.

17. The isolation structure according to claim 14, wherein the first isolation material layer and the second isolation material layer are formed of silicon oxide, and the protection layer is formed of silicon oxynitride.

18. The isolation structure according to claim 14, wherein all of a top surface of the isolation material layer is lower than a topmost surface of the substrate.

19. The isolation structure according to claim 14, wherein a bottommost end of the recess is slightly lower than, aligned with or slightly higher than the topmost surface of the substrate.

* * * * *